United States Patent [19]

Chen et al.

[11] Patent Number: 5,519,632

[45] Date of Patent: May 21, 1996

[54] AUTOMATIC DCS ROUTING FOR MULTILAYER PACKAGES TO MINIMIZE COUPLED NOISE

[75] Inventors: Hai H. Chen, Yorktown Heights; Ling-Hui Hao, Beacon; Philip S. Honsinger, Poughkeepsie; Andrew D. Huber, Poughkeepsie; Thomas J. Lavery, Poughkeepsie; Shuhui Lin, Poughkeepsie, all of N.Y.

[73] Assignee: International Business Machines Corporation, Armonk, N.Y.

[21] Appl. No.: 43,074

[22] Filed: Apr. 5, 1993

[51] Int. Cl.⁶ ................................. G06F 17/50
[52] U.S. Cl. .................. 364/490; 364/489; 364/488
[58] Field of Search ........................ 364/488, 489, 364/490

[56] References Cited

U.S. PATENT DOCUMENTS

| | | | |
|---|---|---|---|
| 4,500,963 | 2/1985 | Smith et al. | 364/300 |
| 4,607,339 | 8/1986 | Davis | 364/491 |
| 4,608,649 | 8/1986 | Davis et al. | 364/491 |
| 4,615,010 | 9/1986 | Davis et al. | 364/491 |
| 4,615,011 | 9/1986 | Linsker | 364/491 |
| 4,624,941 | 9/1986 | Smith et al. | 364/490 |
| 4,870,619 | 9/1989 | Van Ness | 365/208 |
| 5,155,692 | 10/1992 | Lewandowski | 364/489 |
| 5,198,986 | 3/1993 | Ikeda et al. | 364/489 |
| 5,245,550 | 9/1993 | Miki et al. | 364/490 |
| 5,299,136 | 3/1994 | Babakanian et al. | 364/488 |
| 5,337,252 | 8/1994 | Lac et al. | 364/488 |
| 5,361,214 | 11/1994 | Aoki | 364/490 |

FOREIGN PATENT DOCUMENTS

| | | |
|---|---|---|
| 022202 | 1/1990 | Japan . |
| 0265237 | 3/1990 | Japan . |
| 0358544 | 3/1991 | Japan . |

*Primary Examiner*—Vincent N. Trans
*Attorney, Agent, or Firm*—Whitham, Curtis, Whitham & McGinn; Aziz M. Ahsan

[57] ABSTRACT

A routing method for differential current switch (DCS) pairs initially shortens the min/max length window for a first routed rail in order to increase the likelihood that length of the second rail will fall within the window. Next, the routing domain for the first rail is modified so that the first pin exit direction to the route is toward the second pin of the differential current switch pair. A suitable algorithm, such as a prior art mazerouter algorithm, is used to route the first rail along a path restricted to the routing domain. At each proposed via connection for connecting the first rail route from one plane to another, the program accepts the proposed via connection only if there is an available adjacent via for routing the second via. If a via for routing the second rail is not available, the proposed route for the first rail is rejected.

8 Claims, 4 Drawing Sheets

AUTOMATIC DCS ROUTING FOR MULTILAYER PACKAGES TO MINIMIZE COUPLED NOISE

BACKGROUND OF THE INVENTION

1. Field of the Invention

This invention relates to an improved automatic routing method for determining a route for differential current switch (DCS) pairs in a multilayered module, and more particularly to a method for routing the true and complement universal rails of the pair in parallel, one on top of the other in alternate planes of the multilayered module.

2. Description of the Prior Art

Electrical connection of individual components on large, or very large scale integrated circuits and interconnection packages, is achieved using metallic paths between the end points (or pins) which are to be connected. The paths between pins generally can be represented as lying on a grid of links and nodes arranged in a Cartesian coordinate system; x, y or z configuration. A path between two or more pins is referred to as a net. In some instances, it is necessary to use multiple levels of wiring planes wherein a path or a portion of a path must connect with another portion of the path or with a pin on a different plane. This is accomplished by using a "via" which is an etched or drilled hole in the substrate allowing a conductive path to extend from one level to another.

As will be appreciated by those skilled in the art, a single logical net is often physically implemented as a differential current switch pair comprised of two physical connections called rails. Each logical net provides a true and a complement signal and, when the rails are routed in parallel, any coupled noise on the rails tends to be self canceling.

In a particular module to which the teachings of this invention are particularly applicable, single layers of a module are arranged in a repeating configuration in which two adjacent layers carry x-directed conductors (e.g., horizontally directed conductors) followed by two adjacent layers that carry y-directed conductors (e.g., vertically directed conductors). In this module or a multilayered substrate, as illustrated in FIG. 1, the wiring planes are grouped in three pairs of planes in establishing valid wiring paths. In this example two Y-directed pairs and one X-directed pair; namely, (Y1 - Y1'), (X - X'), and (Y2 - Y2') are shown.

A general constraint for all routes is that a connection must be routed on no more than one X and one Y signal layer. An additional constraint with respect to a module or multilayer substrate where the wiring planes are grouped in three pairs of planes as in FIG. 1, differential current switch pairs are routed on the following (TABLE I) plane assignments in order to ensure routing on adjacent planes. For a given first rail plane assignment shown in brackets in the left-hand column, the corresponding second rail plan assignment is shown in brackets in the right-hand column.

TABLE I

| True Plane Rail Routing On: | Complement Plane Rail Routing On: |
| --- | --- |
| (Y1 ,X ) | (Y1',X' ) |
| (Y1',X' ) | (Y1 ,X ) |
| ( X,Y2 ) | ( X',Y2') |
| ( X',Y2') | ( X,Y2 ) |

In addition, each connection listed for routing typically has associated with it a minimum and a maximum length constraint.

A further constraint in routing a differential current switch pair is that the overall routed length of each rail of the pair is approximately the same length of the other (i.e., within a small delta of the other). This constraint is necessary in order to minimize any difference in propagation delay on one rail as compared to the other. Such a differential propagation delay would cause skew between the complimentary signals.

A number of algorithms have been developed to provide a computer generated routing path for individual connections; a path that conforms to inputted path constraint parameters. Any suitable prior art algorithm may be used to route specific paths with constraints in accordance with the teaching of this invention.

Examples of routing algorithms that may be employed in the practice of this invention are described in U.S. Pat. No. 4,615,011, assigned to the assignee of this application and incorporated herein by reference. One class of well-known and widely-used algorithms is known as a mazerouter algorithm, and is the algorithm to which an explanation of a specific embodiment of the invention refers.

Prior art automatic wiring programs (e.g., mazerouter programs) route one connection at a time without regard to the type of net being routed. They do not include program steps that constrain the route of the second rail to be routed to a path parallel to the first routed rail. In addition, in routing the first rail, no provision is made to select a route where there is space to route the two rails in parallel on adjoining levels.

SUMMARY OF THE INVENTION

An object of this invention is the provision of a method for automatically routing differential current switch pairs in mostly parallel paths.

Another object of this invention is the provision of a switch pair routing method that can be used in conjunction with prior art automatic wiring programs, such as programs that use what is commonly referred to in the art as a mazerouter algorithm.

Still another object of the invention is provision of an automatic wiring method that ensures the length of the second rail of a pair is within an acceptable range of the length of the first rail of the pair.

Briefly, this invention contemplates the provision of a method in which, initially, the min/max length window for the first routed rail of a differential current switch pair is shortened in order to increase the likelihood that length of the second rail will fall within the window. Next, the routing domain for the first rail is modified so that the first pin exit direction to the route is toward the second pin of the differential current switch pair. A suitable algorithm, such as a prior art mazerouter algorithm, is used to route the first rail along a path restricted to the routing domain. At each proposed via connection for connecting the first rail route from one plane to another, the program accepts the proposed via connection only if there is an available adjacent via for routing the second via. If a via for routing the second rail is not available, the proposed route for the first rail is rejected.

If the first rail is routed successfully, domain data from the first route is inputted to the routing algorithm to restrict the routing domain of the second rail to the region parallel to the first rail. A path for the second rail is then attempted using the routing algorithm restricted to the domain parallel to the first rail. If a satisfactory route cannot be found for the first rail, it and the second rail are both deleted from the connection list, and rescheduled for a subsequent pass through the connection list. Similarly, if the second rail cannot be satisfactorily routed, the first rail is deleted and the pair scheduled for a subsequent pass.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

The terms pin, rail, path, and via have the same meanings used in this description of the invention as they are commonly understood by those skilled in the art. Namely, end points to be connected are referred to as pins. A via is an etched or drilled hole in a substrate to allow a conductive path to extend from one level in a module to another. A via chain is a series of connected vias extending across multiple layers or planes. A rail is a physical connection between two pins.

Figure 1:
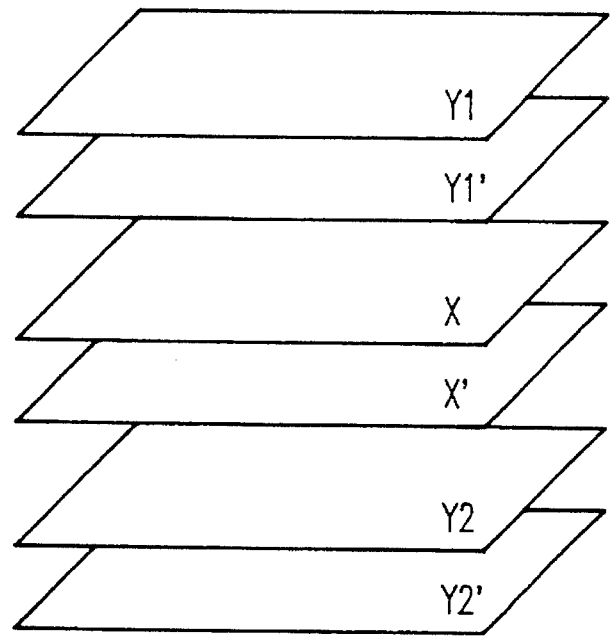
FIG. 1 is a perspective view illustrating the grouping of signal layers or planes in a module of the type in which the routing method of this invention is particularly applicable.
Figure 2:
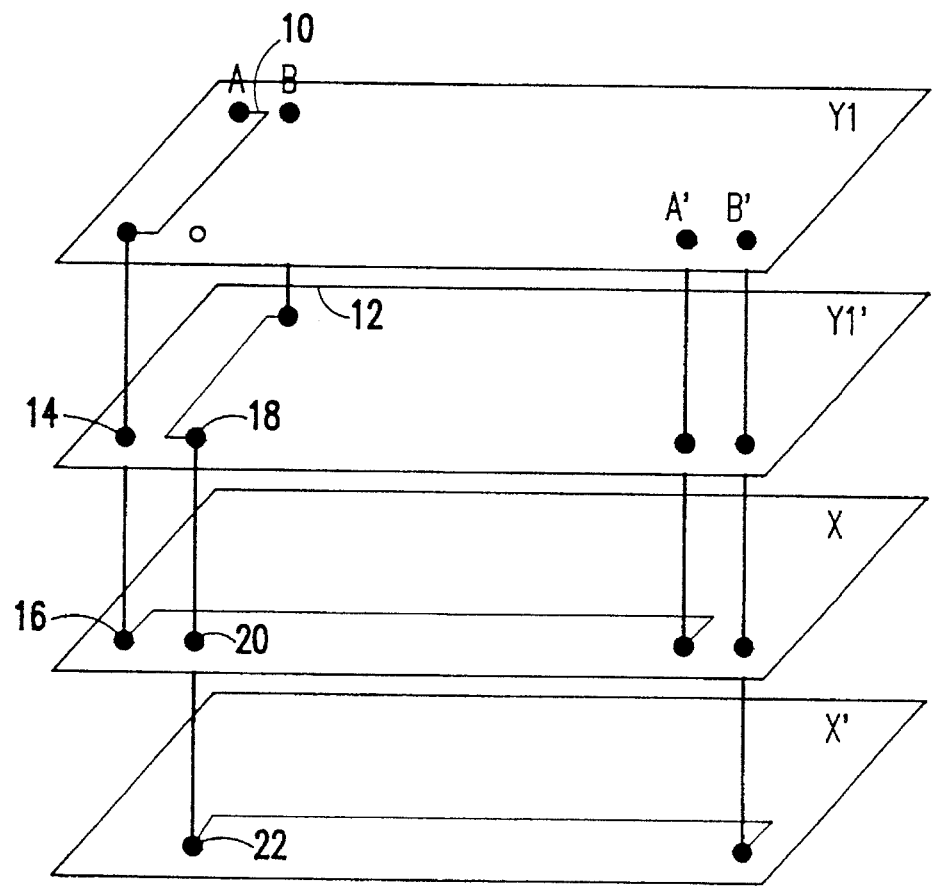
FIG. 2 is a perspective view, similar to FIG. 1, showing routing of a differential current switch pair between points A - B and A'- B'.

Referring now to the drawings, and more particularly to FIG. 2, it illustrates a module of the type shown and explained in connection with FIG. 1. This invention contemplates that the actual detail routing of each rail pair (for example, between points A - B on plane Y1 to points A'- B' on this same plane) will be accomplished by a suitable prior art routing computer program, such as a program that executes a so-called mazerouter routing algorithms described in the aforementioned U.S. Pat. No. 4,615,011. In accordance with the teachings of this invention, certain constraint inputs are generated and inputted to the program to increase the chances that the second rail of the pair can be routed successfully.

As will be appreciated by those skilled in the art, a mazerouter routing program, builds an expanding map of available locations where a rail may be run from an initial point of a set of points until the map includes the other point for the net. The interconnecting protocol of such routing programs accepts inputs that place constraints upon the conductor pattern between points, such as, for example, total conductor length, and layer-to-layer connection paths.

In establishing a routing path for a differential current switch pair routing between points A - B and A'- B' in addition to general constraints applicable to all connections, the first rail of the pair is routed with the following special constraints in accordance with the invention. The paths around point A are blocked so that the initial route segment 10 is in the direction of point B. This is to ensure that the second rail of the pair, which is connected by a via path 12 initially to plane Y1', can be routed initially parallel to the first rail. Next, at each proposed via location where the plane of the proposed route of the first rail is to be changed (e.g., via locations 14 and 16 to change from the Y1 plane to the X plane) the adjacent regions on the Y1' plane, the X plane, and the X' plane are examined to determine that a via (e.g., vias 18, 20 and 22) is available on each of these planes adjacent the first rail vias for connecting the second rail of the pair from the Y1' plane to the X' plane along a route parallel to the first rail. If the requested vias are not available for the second rail, the proposed route for the first rail is rejected and an alternative route for the first rail is sought by the router program.

Figure 3:
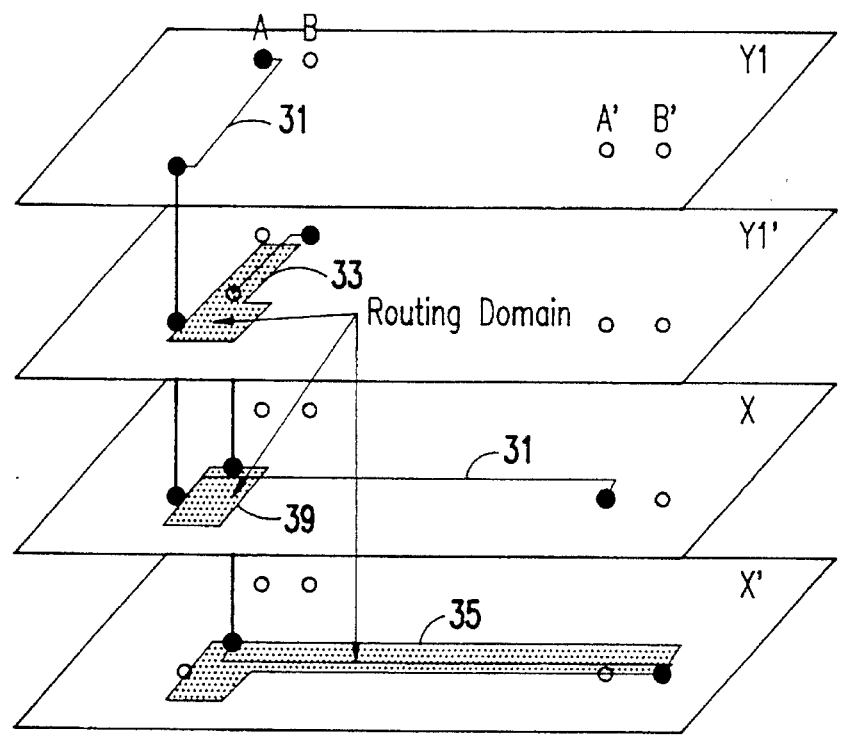
FIG. 3 is another perspective illustration, similar to FIG. 2, showing a routing domain established for the second rail of a differential current switch pair when routing the first rail in accordance with the teachings of this invention.

Referring now to FIG. 3, successful routing of a first rail 31 of the pair between pin A and A', determines a domain 33 on the Y1' plane and a domain 35 on the X' plane (planes directly under the first rail segments) where the second rail is to be routed. This domain data is inputted to the routing program as a constraint when routing the second rail of the pair in order to limit the route of the second rail. These domains are narrow strips, shown shaded in FIG. 3, beneath each first rail segment. These domains for the second rail may be established conveniently by inputting to the routing program the coordinates of the beginning and end points of the first rail line segments. In addition, a domain 39 is established in the region of a first rail vias as based on the coordinate positions of the adjacent vias, as explained in more detail in connection with FIG. 5.

Figure 4A:
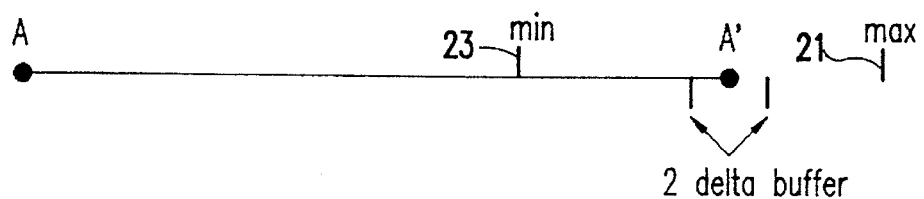
FIGS. 4A, 4B and 4C are diagrams to illustrate modifications, in accordance with the teachings of this invention, to the min/max rail length constraints of the first rail of a differential current switch pair.
Figure 4B:
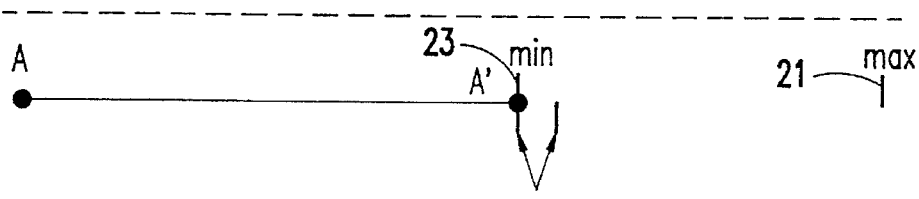
Figure 4C:
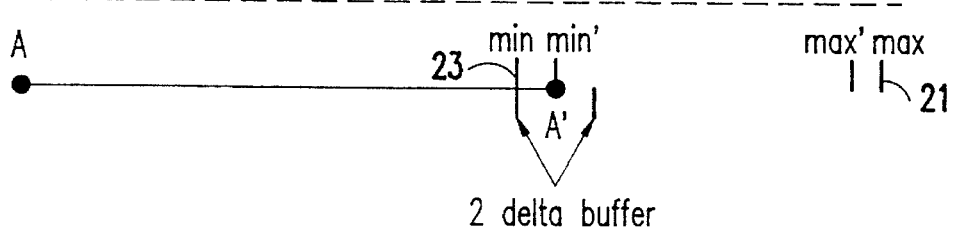

Referring now to FIGS. 4A, 4B and 4C, as will be appreciated by those skilled in the art, due to signal propagation time, differential current switch pairs will have minimum and/or maximum constraints on the length of a rail. That is, the routed length of the connection A-A' may not exceed the maximum length 21 and may not be less than the minimum length 23. Each rail of a differential current switch pair has the same minimum and maximum length constraint. In addition, the length of one rail of a differential current switch pair must be approximately equal to the length of the other; i.e., one rail length must equal the other, plus or minus a small buffer length, delta. Once the first rail (A-A') is routed, the length of the second rail may be only one delta longer or one delta shorter than the first rail, as indicated graphically in FIG. 4A. However, as indicated in FIG. 4B, if the first rail is successfully routed, but with its length close to either the minimum or maximum allowable length, the buffer for the second rail is only one delta. Otherwise, the second rail could exceed the overall minimum and/or maximum constraint. In accordance with the teachings of this invention, in order to ensure that there is as large a buffer as possible when routing the second rail, an adjustment is made to the minimum and maximum length constraints before attempting to route the first rail. As indicated in FIG. 4C, a length equal to one delta is added to the minimum allowable length to establish a new minimum, min' and subtracted from the maximum length to establish a new maximum, max'. This operation has the effect of shortening the length of the window in which the first rail must be routed, but ensures that the second rail will have a window equal in length to two delta.

Figure 5:
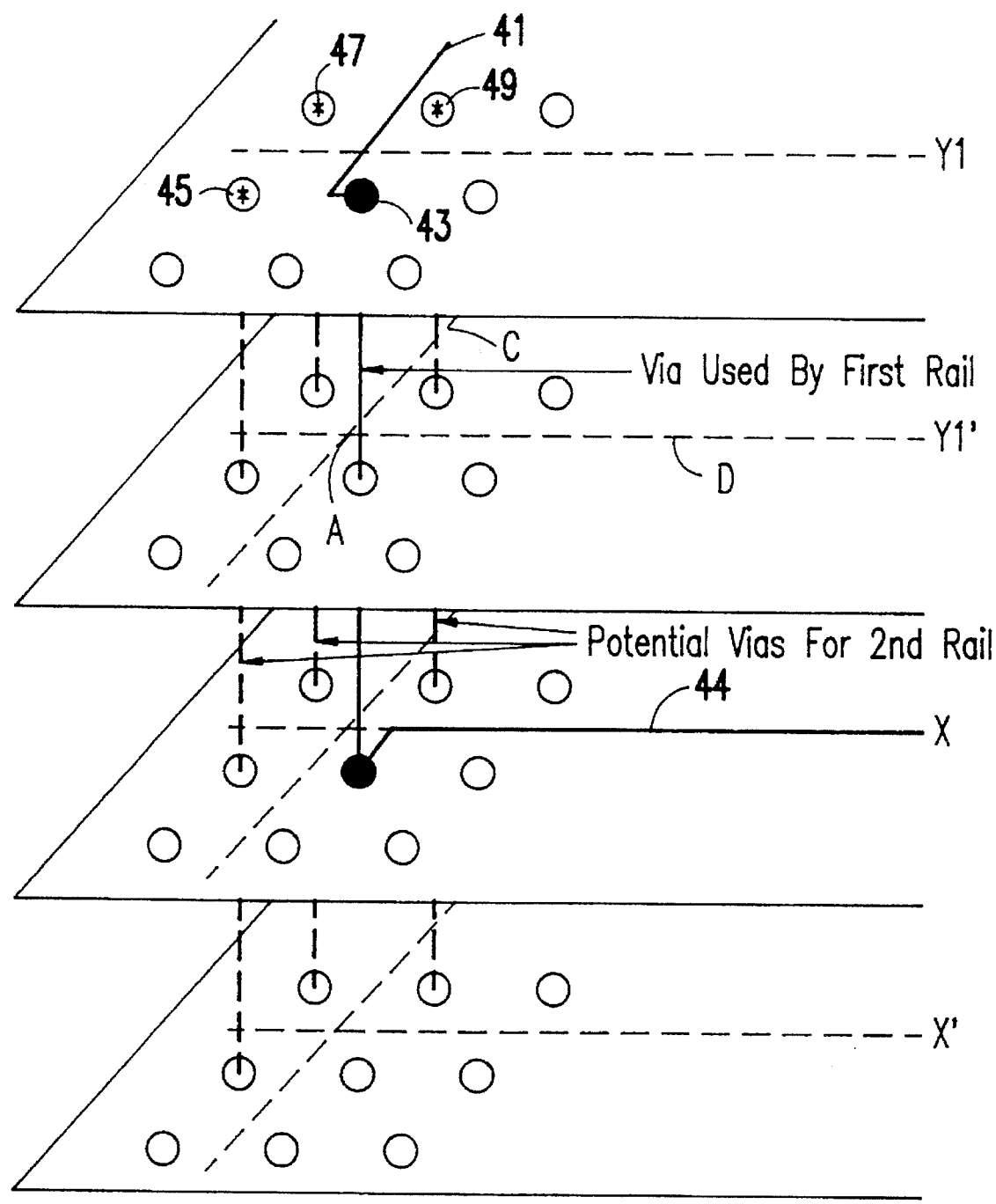
FIG. 5 is another perspective illustration of the via domain limitation, in routing the first rail, to ensure there is an available via for routing the second rail.

Referring now to FIG. 5, as previously mentioned, in accordance with the teachings of this invention, whenever a via chain is used in the routing of the first rail of a differential current switch pair, the proposed route is accepted only if there is an adjacent available via chain for routing the second rail. Assuming, as is the typical case, that the vias are spaced uniformly in a tight grid pattern, for each via used by the first rail, there are only three acceptable via chains the second rail can use that will provide the second rail with a route that parallels the first rail. The acceptable vias are those that are adjacent the intersection of the first rail segment path leading to a via and the first rail segment path leading away from the via. Use of any other via for the second rail would result in a second rail segment that was not parallel to the first rail. In FIG. 5, a segment 41 of the first rail leads up to a via chain 43 on plane Y1 and the first rail continues as segment 44 away from via chain 43 on plane X. The paths C and D of the first rail intersect at point A and the potentially acceptable via chains for the second rail are via chains 45, 47 and 49.

To determine which vias to check as a potentially available via for the second rail, the routing program determines the intersection point A of the tracks of the major first rail line segments leading to the via and leading away from the via, lines C and D respectively, on planes Y1 and X. These are, of course, the tracks along which the second rail must be routed. Use of any other via by the second rail would result in a segment of the second rail that is not parallel to the first rail. To ensure that the second rail can be routed successfully, one of the three adjacent via chains 45, 47 or 49 must be available. If there is no "adjacent" via available, the proposed routing of the first rail is rejected and an alternate route is attempted.

Figure 6:
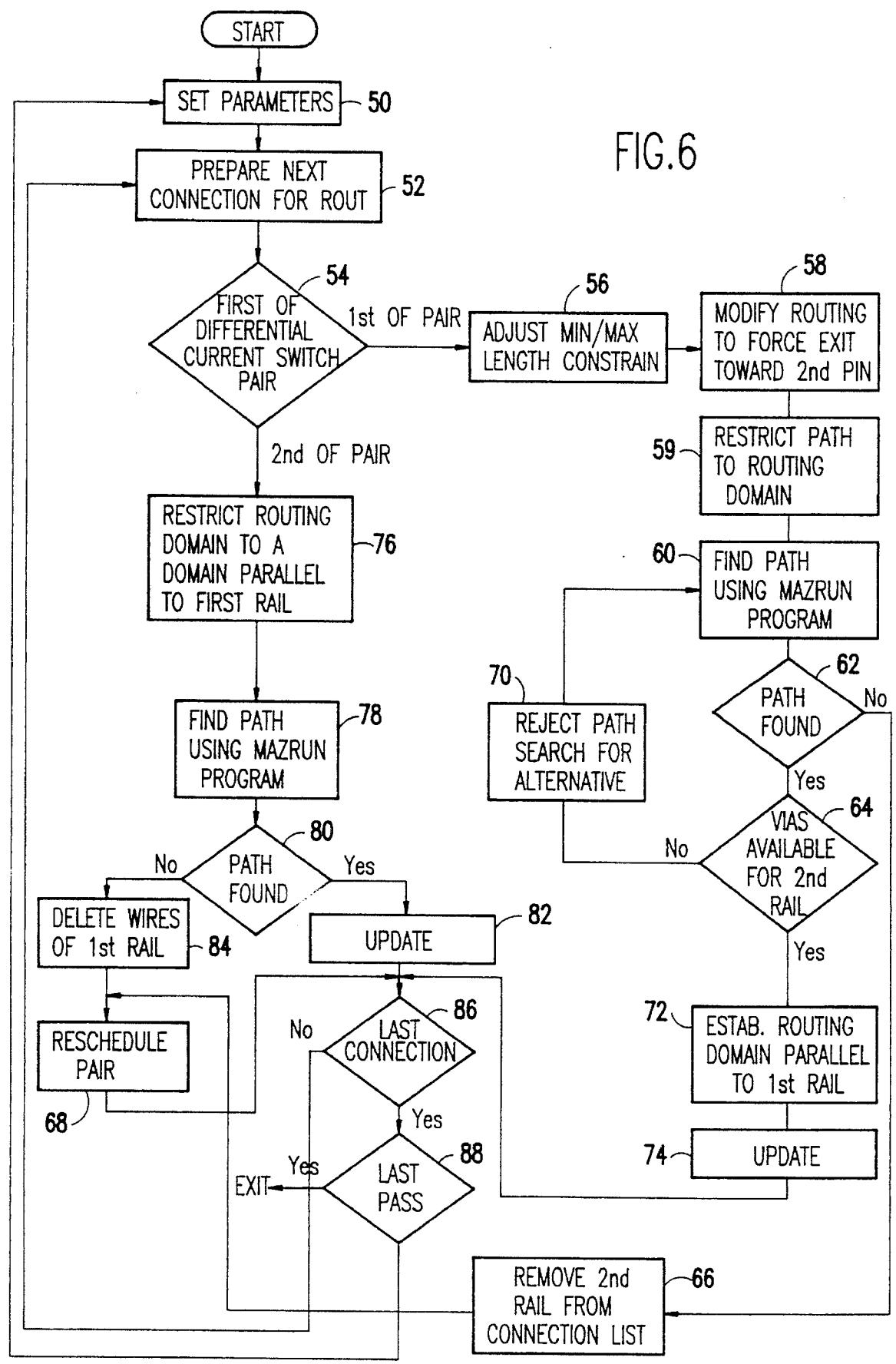
FIG. 6 is a flow diagram of a procedure to route differential current switch pairs in accordance with the teachings of this invention.

Referring now to FIG. 6, the operation starts by setting general routing parameters, block 50, that are applicable to all connections for one pass through the connection list. The next rail on the list is prepared for routing, block 52, and a check is made at block 54 to determine if it is the first rail (i.e., the routing program routine that limits the path the router program can take) of a differential current switch pair.

If it is the first rail of a differential current switch pair, the min/max parameters of the first rail are adjusted (block 56) in the manner described in connection with FIG. 5 in order to improve the chance of successfully routing the second rail. Next the routing image of the first rail is constrained to force the connection segment emanating from the first pin (e.g., pin A in FIGS. 2 and 3) in the direction of the second pin (e.g., pin B in FIGS. 2 and 3), block 58. At block 59 the path for the first rail is restricted to the routing domain (e.g., the plane sets of TABLE I, page 4) established by the parameters in block 50. A path is then sought for the first rail, block 60. If a routing path is found, block 62, the via adjacent those used in the path are checked (block 64) as described in connection with FIG. 5 to ensure there are available vias for the second rail. If a route for the first rail is not found at block 62, the second rail of the pair is removed from the list for this pass at block 66 and pair may be rescheduled for the next pass, block 68. If a route is found, but all the required vias are not available for the second rail, the path is rejected and a new path is sought, block 70. If there are vias available for the second rail (block 64) parameters the data base is updated to indicate the route of the first rail, block 74.

Assuming the first rail of the pair has been routed successfully, the routing domain for the second rail of the pair is restricted to a path parallel to the first path, block 76. A path is then sought for the second rail, block 78, restricted by both the parameters established in block 50 and those established in block 76. If a path is found at decision block 80, the data base is updated at block 82 with data indicating the route for the second rail of the pair. If a route is not found, the wiring route for the first rail of the pair is deleted from the data base, block 84, and the pair is rescheduled, block 68. Decision blocks 86 and 88 determine completion of successful routing of the last connection of a pair, and last pair of the list, respectively.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A computer implemented method for routing a first rail and a second rail of a differential current switch pair in an electronic component by means of a computer routing program that routes said first rail and said second rail separately in response to parameter constraints inputted to said computer routing program, comprising the steps of:

A. in routing the first rail:
 a. establishing a routing domain parameter constraint for said second rail parallel to an accepted proposed route for said first rail;

B. in routing the second rail:
 a. restricting a routing domain for said second rail to the routing domain established in paragraph A. a. above.

2. A method for routing a first rail and a second rail of a differential current switch pair by means of a computer routing program as in claim 1, wherein said first rail is routed on two pairs of parallel planes, said first rail routed on a first plane of a first pair of said two pairs of parallel planes and a first plane of a second pair of said two parallel planes, said second rail routed on a second pair of said first pair of said two pair of parallel planes and a second plane of said second pair of said two parallel planes.

3. A computer implemented method for routing a first rail and a second rail of a differential current switch pair in an electronic component by means of a computer routing program that routes said first rail and said second rail separately in response to parameter constraints inputted to said computer routing program, comprising the steps of:

A. in routing the first rail:
 a. accepting a proposed route for first rail only if a via is available for said second rail immediately adjacent each via in said proposed rail;
 b. establishing a routing domain parameter constraint for said second rail parallel to an accepted proposed route for said first rail;

B. in routing the second rail:
 a. restricting a routing domain for said second rail to the routing domain established in paragraph A. b. above.

4. A method for routing a first rail and a second rail of a differential current switch pair by means of a computer routing program as in claim 3, wherein said first rail is routed on two pairs of parallel planes, said first rail routed on a first plane of a first pair of said two pairs of parallel planes and a first plane of a second pair of said two parallel planes, said second rail routed on a second pair of said first pair of said two pair of parallel planes and a second plane of said second pair of said two parallel planes.

5. A computer implemented method for routing a first rail and a second rail of a differential current switch pair in an electronic component by means of a computer routing program that routes said first rail and said second rail separately in response to parameter constraints inputted to said computer routing program, comprising the steps of:

A. in routing the first rail:
  a. forcing an initial route segment from a first pin of said first rail in a direction toward a first pine of said second rail;
  b. accepting a proposed route for first rail only if a via is available for said second rail immediately adjacent each via in said proposed rail;
  c. establishing a routing domain parameter constraint for said second rail parallel to an accepted proposed route for said first rail;

B. in routing the second rail:
  a. restricting a routing domain for said second rail to the routing domain established in paragraph A. c. above.

6. A method for routing a first rail and a second rail of a differential current switch pair by means of a computer routing program as in claim 5, wherein said first rail is routed on two pairs of parallel planes, said first rail routed on a first plane of a first pair of said two pairs of parallel planes and a first plane of a second pair of said two parallel planes, said second rail routed on a second pair of said first pair of said two pair of parallel planes and a second plane of said second pair of said two parallel planes.

7. A computer implemented method for routing a first rail and a second rail of a differential current switch pair in an electronic component by means of a computer routing program that routes said first rail and said second rail separately in response to parameter constraints inputted to said computer routing program, comprising the steps of:

A. in routing the first rail:
  a. shortening a maximum rail length parameter constraint and lengthening a minimum rail length parameter constraint inputs to said computer routing program;
  b. forcing an initial route segment from a first pin of said first rail in a direction toward a first pin of said second rail;
  c. accepting a proposed route for first rail only if a via is available for said second rail immediately adjacent each via in said proposed route;
  d. establishing a routing domain parameter constraint for said second rail parallel to an accepted proposed route for said first rail;

B. in routing the second rail:
  a. restricting a routing domain for said second rail to the routing domain established in paragraph A. d. above.

8. A method for routing a first rail and a second rail of a differential current switch pair by means of a computer routing program as in claim 7, wherein said first rail is routed on two pairs of parallel planes, said first rail routed on a first plane of a first pair of said two pairs of parallel planes and a first plane of a second pair of said two parallel planes, said second rail routed on a second pair of said first pair of said two pair of parallel planes and a second plane of said second pair of said two parallel planes.

* * * * *